United States Patent
Yamamoto

(10) Patent No.: US 10,783,822 B2
(45) Date of Patent: Sep. 22, 2020

(54) TRANSFER CIRCUIT, SHIFT REGISTER, GATE DRIVER, DISPLAY PANEL, AND FLEXIBLE SUBSTRATE

(71) Applicant: JOLED INC., Tokyo (JP)

(72) Inventor: Tetsuro Yamamoto, Tokyo (JP)

(73) Assignee: JOLED INC., Tokyo (JP)

(*) Notice: Subject to any disclaimer, the term of this patent is extended or adjusted under 35 U.S.C. 154(b) by 25 days.

(21) Appl. No.: 16/233,956

(22) Filed: Dec. 27, 2018

(65) Prior Publication Data

US 2019/0213945 A1   Jul. 11, 2019

(30) Foreign Application Priority Data

Jan. 10, 2018 (JP) .................................. 2018-001893

(51) Int. Cl.
  G09G 3/32     (2016.01)
  G09G 3/36     (2006.01)
  G11C 19/28    (2006.01)
  G09G 3/3266   (2016.01)

(52) U.S. Cl.
  CPC ............. *G09G 3/32* (2013.01); *G09G 3/3266* (2013.01); *G09G 3/3648* (2013.01); *G11C 19/28* (2013.01); *G09G 2310/0286* (2013.01)

(58) Field of Classification Search
  CPC .......................... G09G 3/3266; G09G 3/3648
  See application file for complete search history.

(56) References Cited

U.S. PATENT DOCUMENTS

| | | | |
|---|---|---|---|
| 2006/0001637 A1* | 1/2006 | Pak | G11C 19/184 345/100 |
| 2013/0009856 A1 | 1/2013 | Takahashi et al. | |
| 2017/0061879 A1 | 3/2017 | Fujimura | |
| 2017/0221439 A1* | 8/2017 | Chen | G11C 19/28 |

FOREIGN PATENT DOCUMENTS

| | | |
|---|---|---|
| JP | 2017-045499 | 3/2017 |
| WO | 2011/129126 | 10/2011 |

* cited by examiner

*Primary Examiner* — Gerald Johnson
(74) *Attorney, Agent, or Firm* — Greenblum & Bernstein, P.L.C.

(57) ABSTRACT

A transfer circuit includes an input circuit, a reset circuit, an output circuit, and an output stabilizer circuit, and obtains an input signal at an input terminal, holds the input signal, and outputs the input signal from an output terminal as an output signal in synchronization with a clock signal. The output stabilizer circuit includes an inverter circuit and a transistor. The inverter circuit outputs from an output terminal an inverted signal having an inverted polarity of at least one of the input signal and the output signal. The transistor has a control signal end connected to the output terminal of the inverter circuit, a first main signal end connected to a power supply line of the output stabilizer circuit, and a second main signal end connected to the output terminal of the transfer circuit.

18 Claims, 24 Drawing Sheets

(P3: During output)

(P3: Finish output)

TRANSFER CIRCUIT, SHIFT REGISTER, GATE DRIVER, DISPLAY PANEL, AND FLEXIBLE SUBSTRATE

CROSS REFERENCE TO RELATED APPLICATION

The present application is based on and claims priority of Japanese Patent Application No. 2018-001893 filed on Jan. 10, 2018. The entire disclosure of the above-identified application, including the specification, drawings and claims is incorporated herein by reference in its entirety.

FIELD

The present disclosure relates to a transfer circuit, a shift register, a gate driver, a display panel, and a flexible substrate.

BACKGROUND

Conventionally, display devices having a plurality of pixel circuits arranged in a matrix have been widely put into practical use. Such display devices display an image by driving the plurality of pixel circuits row by row, using a control signal applied at different timing for each row. The control signal applied row by row is generated using, for example, a shift register. Japanese Unexamined Patent Application Publication No. 2017-45499 (Patent Literature (PTL) 1) discloses a register circuit which can be used as a transfer circuit at each stage of such a shift register.

CITATION LIST

Patent Literature

[PTL 1] Japanese Unexamined Patent Application Publication No. 2017-45499

SUMMARY

Technical Problem

With the register circuit disclosed in Japanese Unexamined Patent Application Publication No. 2017-45499, the potential of an output signal slightly rises in some cases although it is supposed to be at the low level. There is thus apprehension that, with the shift register formed by connecting a plurality of such register circuits, repeated transfer of the control signal could lead to accumulation of rise in the potential and could thereby result in malfunction.

In view of this, the present disclosure has an object to provide a transfer circuit that does not easily cause an undesired rise in the potential of the output signal, and also provide a shift register, a gate driver, a display panel, and a flexible substrate using such a transfer circuit.

Solution to Problem

In order to achieve the above object, a transfer circuit according to an aspect of the present disclosure is a transfer circuit that includes an input circuit, a reset circuit, an output circuit, and an output stabilizer circuit, and obtains an input signal at an input terminal, holds the input signal, and outputs the input signal from an output terminal as an output signal in synchronization with a clock signal, the transfer circuit including, in the output stabilizer circuit: an inverter circuit that is connected to one or both of the input terminal and the output terminal of the transfer circuit, and outputs an inverted signal from an output terminal, the inverted signal having an inverted polarity of at least one of the input signal and the output signal; and a first transistor having a control signal end connected to the output terminal of the inverter circuit, a first main signal end connected to a first power supply that is a power supply for the output stabilizer circuit, and a second main signal end connected to the output terminal of the transfer circuit.

Advantageous Effects

According to such a configuration, when at least one of the input signal and the output signal of the transfer circuit is at the low level, the inverted signal becomes high level and places the first transistor in the ON state. As a result, since the output terminal of the transfer circuit is connected to the first power supply via the first transistor when the output signal of the transfer circuit is supposed to be at the low level, the potential of the output signal of the transfer circuit is inhibited from rising.

With a shift register formed by connecting a plurality of such transfer circuits, repeated transfer of the control signal does not easily cause accumulation of rise in potential, thereby reducing occurrence of malfunction.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS (Underlying Knowledge Forming the Basis of the Present Disclosure)

Prior to describing some embodiments of the present disclosure, the following describes the configuration of a register circuit according to a conventional example and the risk of malfunction discovered by the inventor.

Figure 1:
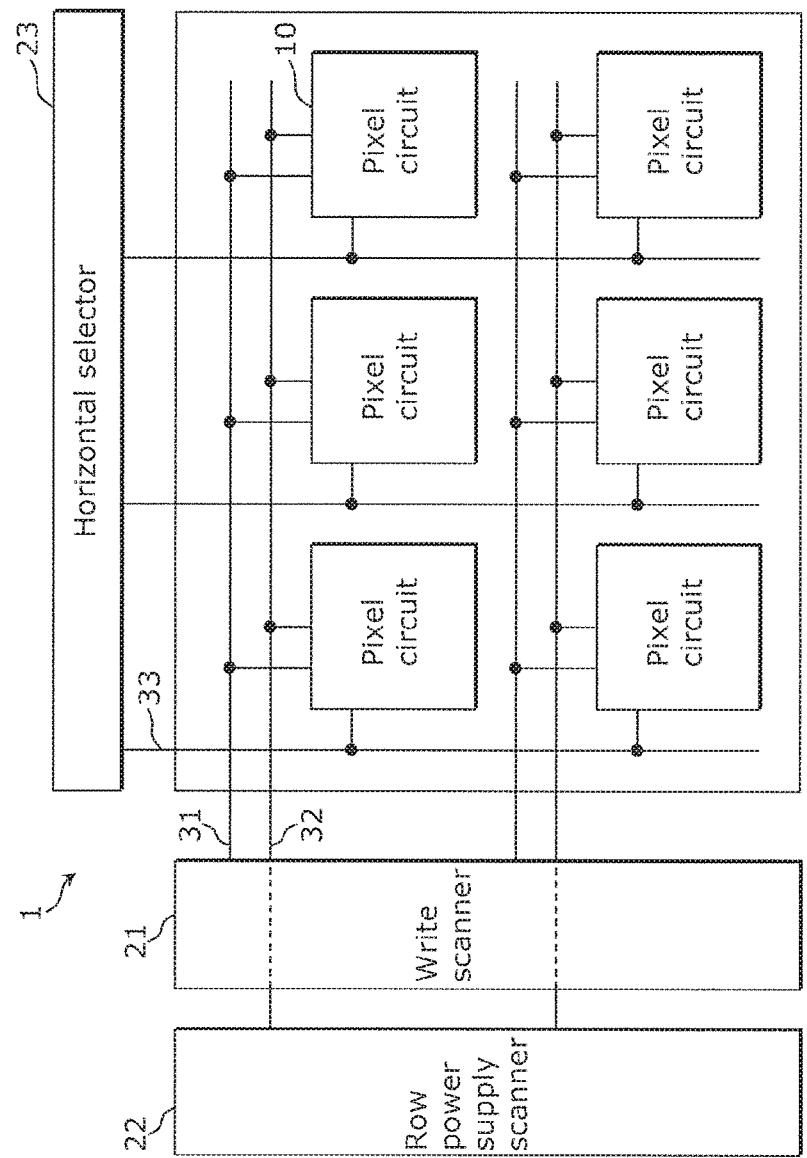
FIG. 1 is a functional block diagram illustrating an example of a configuration of the main part of a common display device.

FIG. 1 is a functional block diagram illustrating an example of a configuration of the main part of a common display device. As illustrated in FIG. 1, the main part of a display device 1 includes a plurality of pixel circuits 10, a write scanner 21, a row power supply scanner 22, a horizontal selector 23, scan signal lines 31 and 32, and data signal lines 33.

The plurality of pixel circuits 10 are arranged in a matrix. Each row of the matrix is provided with the scan signal lines 31 and 32 connected to a plurality of pixel circuits 10 disposed in the same row, and each column of the matrix is provided with a data signal line 33 connected to a plurality of pixel circuits 10 disposed in the same column.

The write scanner 21 and the row power supply scanner 22 supply, via the scan signal lines 31 and 32, the pixel circuits 10 with a write signal and a row power supply, respectively, for controlling the operations of the pixel circuits 10 at timing unique to each row.

The horizontal selector 23 supplies the pixel circuits 10 with a data signal corresponding to luminance via the data signal lines 33.

Figure 2:
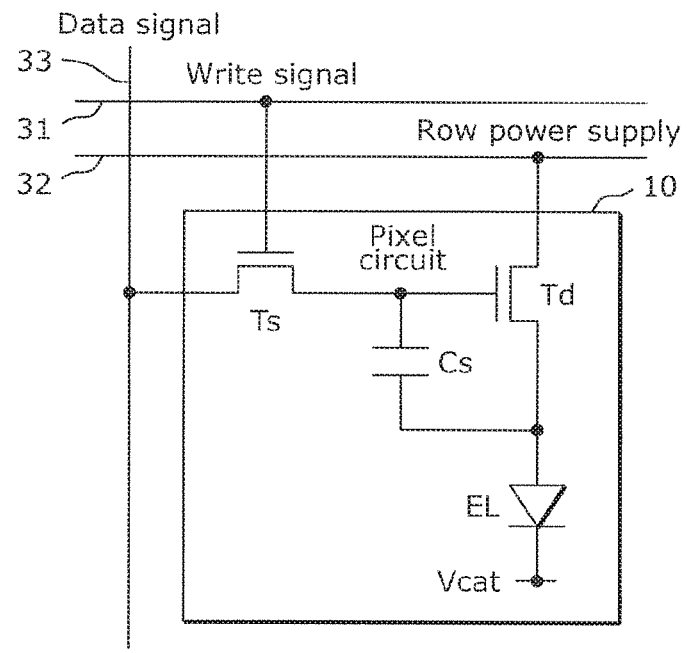
FIG. 2 is a circuit diagram illustrating an example of a configuration of a simplified pixel circuit.

FIG. 2 is a circuit diagram illustrating an example of a configuration of a simplified pixel circuit, and shows an example of a pixel circuit included in an active-matrix organic electroluminescent (EL) display device.

Since organic EL elements are current-driven light-emitting elements, the color gradation is provided by controlling the amount of current flowing through the organic EL elements. In the pixel circuit illustrated in FIG. 2, a driving transistor Td supplies the EL element with an amount of current in accordance with a data voltage held by a holding capacitor Cs via a switching transistor Ts.

Figure 3:
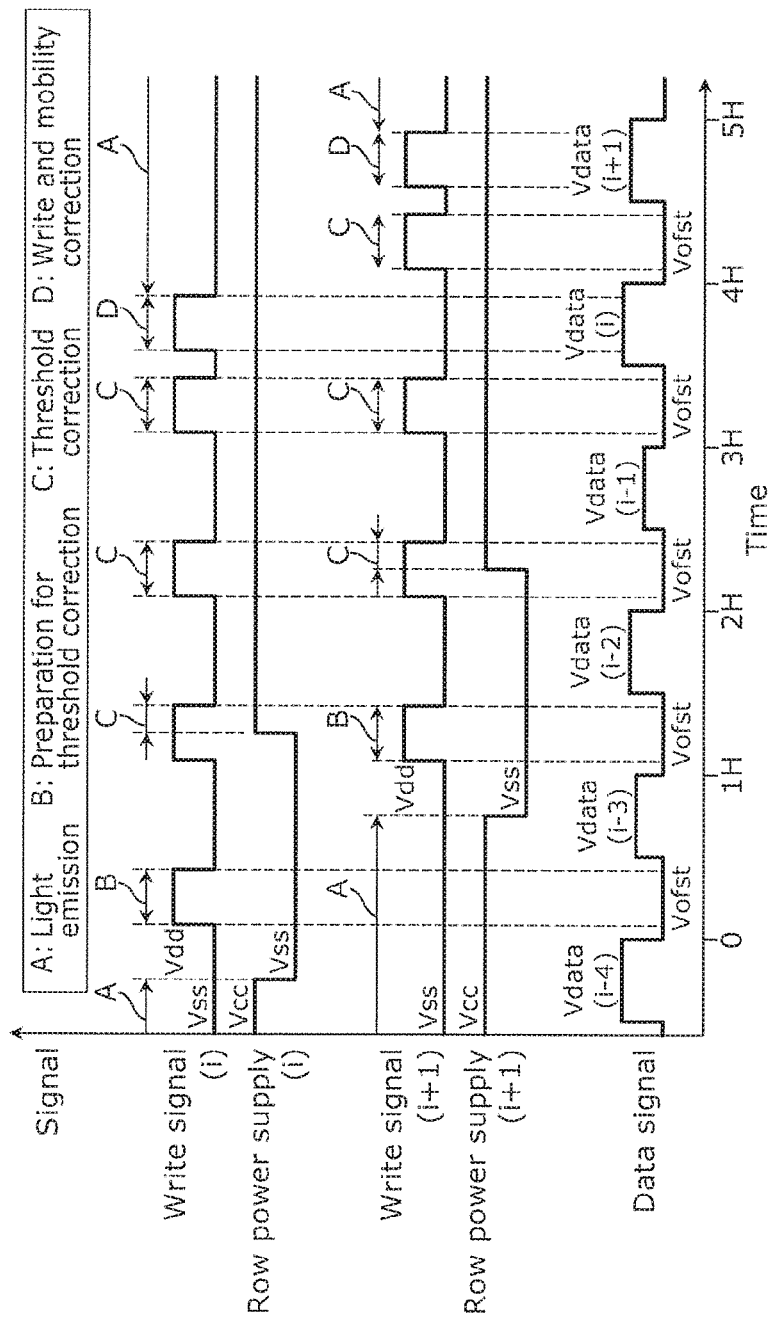
FIG. 3 is a timing chart illustrating an example of operations of a display device.

FIG. 3 is a timing chart illustrating an example of operations of the display device 1, and shows an example of time waveforms of the write signal, the row power supply, and the data signal supplied to the pixel circuits 10 located in two adjacent rows. The parenthesized numbers given at the end of the reference signs in FIG. 3 denote corresponding row numbers.

By receiving the write signal and the row power supply having the waveforms illustrated in FIG. 3, the pixel circuits 10 perform, after light emission is finished for a preceding frame, preparation for threshold correction, threshold correction, and write and mobility correction over four horizontal synchronization (H) periods, and start light emission for a subsequent frame. Note that the details of the configuration and operations of the pixel circuits 10 will not be described as the pixel circuits 10 are not the main aspect of the present disclosure and a well-known technology is used as appropriate.

As the write scanner 21 and the row power supply scanner 22 respectively supply the write signal and the row power supply at timing shifted for each row, the pixel circuits 10 perform light emission, preparation for threshold correction, threshold correction, and write and mobility correction at different timing for each row (for example, at timing shifted by one horizontal synchronization period for each row).

The write scanner 21 and the row power supply scanner 22 may be provided in a driver IC, or may be incorporated into the display panel for cost reduction. A scanner circuit that, like the write scanner 21 and the row power supply scanner 22, outputs a plurality of signals having the same waveform at different timing can be implemented using, for example, a shift register.

Figure 4:
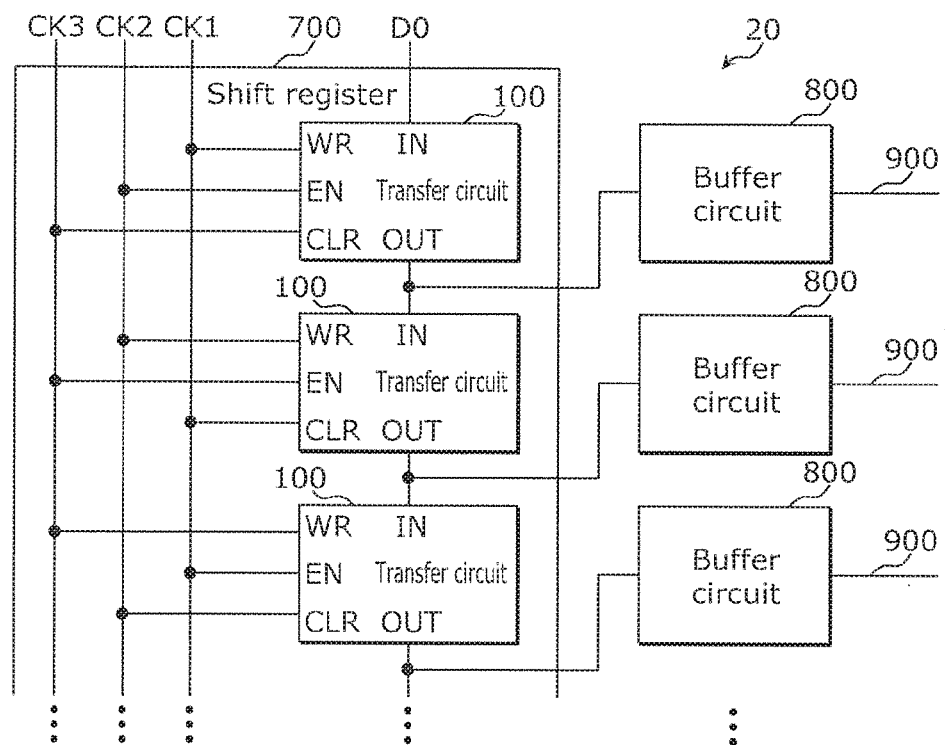
FIG. 4 is a functional block diagram illustrating an example of a schematic configuration of a scanner circuit.

FIG. 4 is a functional block diagram illustrating an example of a schematic configuration of a scanner circuit 20, and shows a part of a general-purpose circuit configuration applicable to both the write scanner 21 and the row power supply scanner 22. The scanner circuit 20 includes: a shift register 700 including a plurality of transfer circuits 100 connected in series; and a plurality of buffer circuits 800 that drive output signal lines 900 according to the output of the transfer circuits 100. The transfer circuits 100, the buffer circuits 800, and the output signal lines 900 are provided corresponding to the rows of the display device 1. The shift register 700 is, for example, a three-phase drive shift register that operates according to three-phase clock signals CK1, CK2, and CK3 whose active periods do not overlap each other.

In general, in peripheral drive circuits and pixel circuits, amorphous silicon (aSi)-thin film transistors (TFTs) or oxide TFTs whose processes are simpler than low temperature polysilicon (LTPS)-TFTs are often used for cost reduction. However, unlike the LTPS-TFTs, only the transistors of the N-channel are put into practical use as the aSi-TFTs and the oxide TFTs. Consequently, circuits including the aSi-TFTs and the oxide TFTs tend to be complicated.

In recent years, oxide TFTs have attracted attention due to their properties such as low leakage and high mobility in addition to ease of fabrication. However, due to the reason that the threshold voltage of the oxide TFT is generally negative (depletion type) in addition to the reason that only the transistors of the N-channel are put into practical use as described above, it is necessary to inhibit occurrence of malfunction even when the threshold voltages of the TFTs in peripheral drive circuits are negative.

For example, the register circuit disclosed in Japanese Unexamined Patent Application Publication No. 2017-45499 can be used as the transfer circuit 100 in each stage of the shift register 700.

Figure 5:
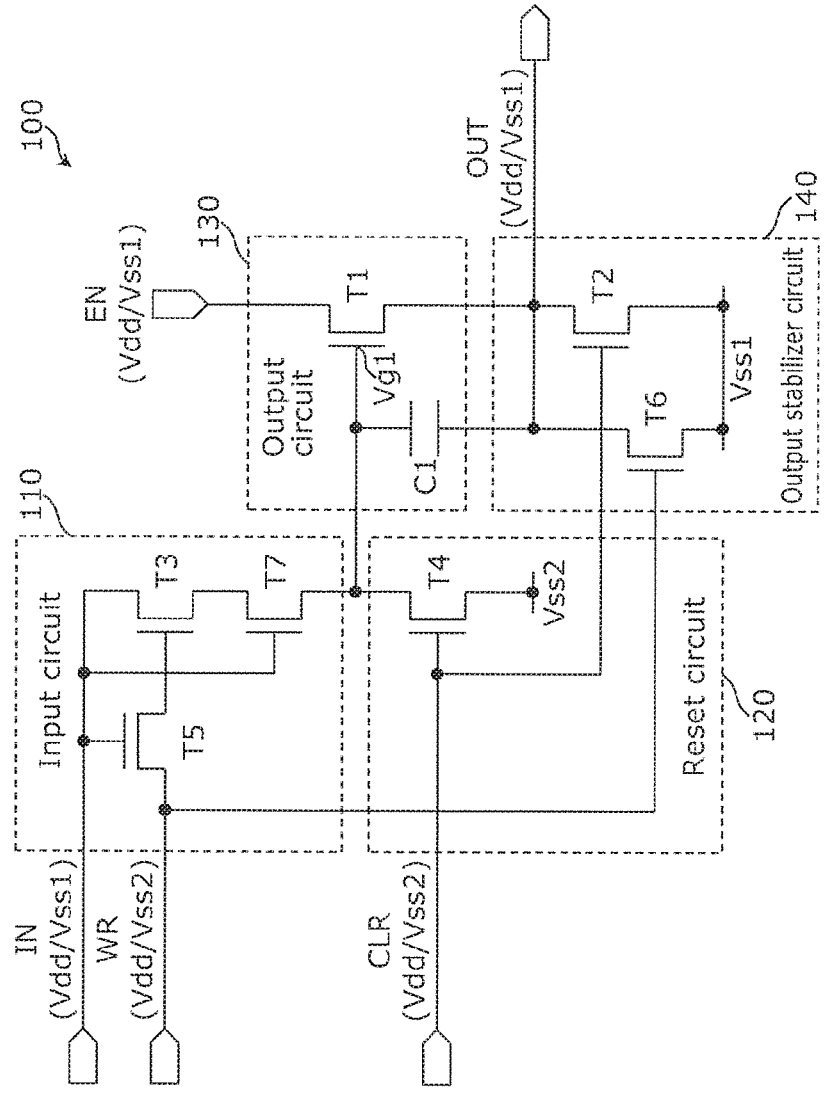
FIG. 5 is a circuit diagram illustrating an example of a configuration of a transfer circuit according to a conventional example.

FIG. 5 is a circuit diagram illustrating an example of a configuration of the transfer circuit 100, and shows the register circuit illustrated in FIG. 13 of Japanese Unexamined Patent Application Publication No. 2017-45499. The reference signs in the figure are changed from those in Japanese Unexamined Patent Application Publication No. 2017-45499 as appropriate. In FIG. 5, the parenthesized reference signs added to the signal names are power supply potentials representing the typical potentials of the signals at the high level and the low level.

In the following description, for the sake of brevity, a signal and a terminal for inputting and outputting the signal are denoted by the same reference sign, and the potential of a power supply and a power supply line for supplying power having that potential are denoted by the same reference sign.

The transfer circuit 100 includes an input circuit 110, a reset circuit 120, an output circuit 130, and an output stabilizer circuit 140. The transfer circuit 100 obtains and holds an input signal IN and outputs the signal as an output signal OUT in synchronization with control signals WR, EN, and CLR.

As illustrated in FIG. 4, the plurality of transfer circuits 100 operate according to, as the control signals WR, EN, and CLR, a set of clock signals CK1, CK2, and CK3 that are different for every three stages, and transfer a signal supplied to an input terminal DO. When the control signals WR, EN, and CLR are different in amplitude, the set of the clock signals CK1, CK2, and CK3 in FIG. 4 may be provided for each of the control signals different in amplitude.

Figure 6:
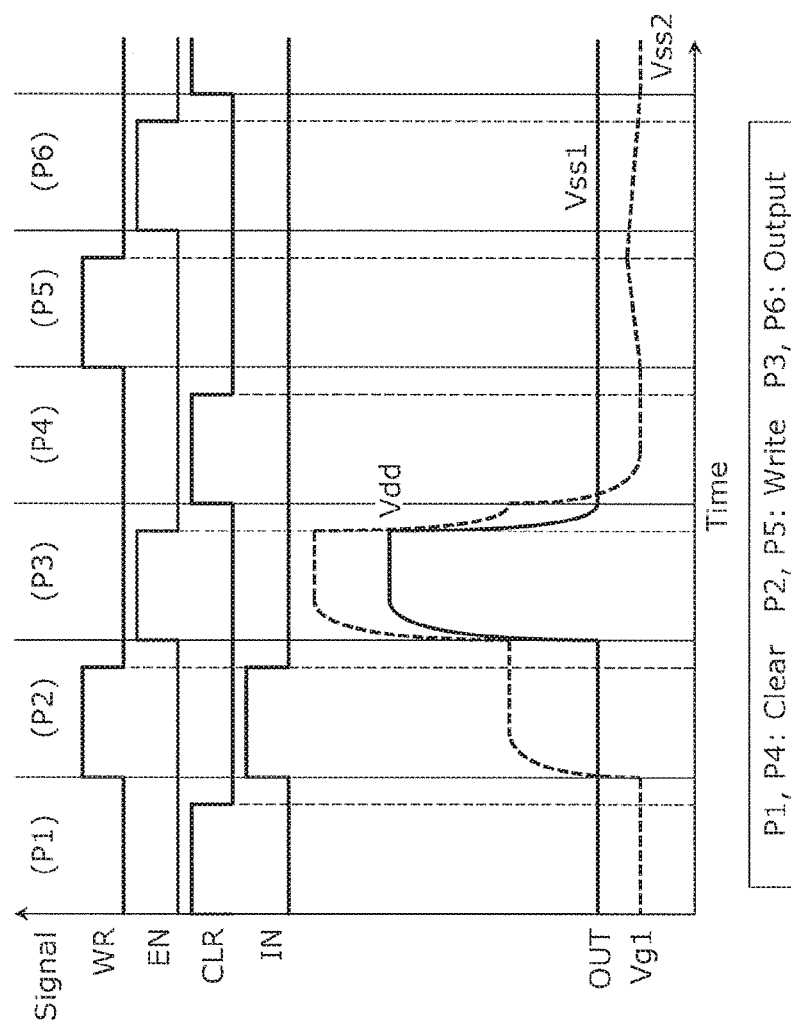
FIG. 6 is a timing chart illustrating an example of operations of a transfer circuit according to a comparative example.

FIG. 6 is a timing chart illustrating an example of basic operations of the transfer circuit 100 considered by the inventor as a comparative example.

FIG. 7A to FIG. 7F are circuit diagrams each illustrating an example of an operating state of the transfer circuit 100 in the main part of the timing chart in FIG. 6. In FIG. 7A to FIG. 7F, the transistors in the ON state are indicated by solid lines, and the transistors in the OFF state are indicated by dotted lines. Transmission of a potential is indicated by a dashed arrow.

Figure 7A:
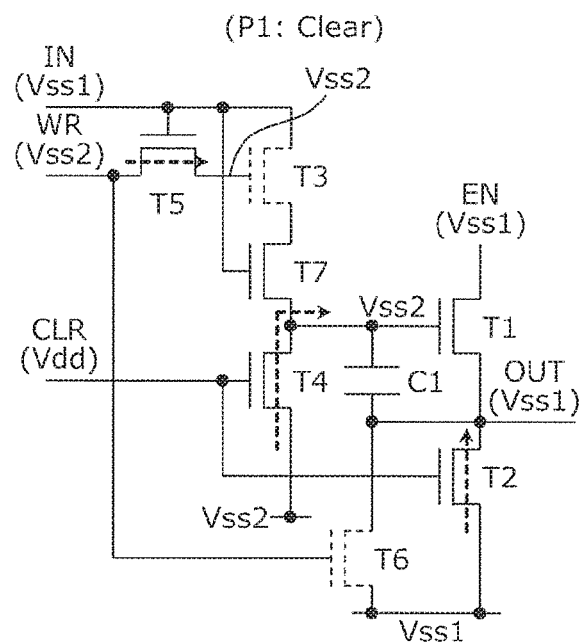
FIG. 7A is a circuit diagram illustrating an example of an operating state of the transfer circuit according to the comparative example.

In a period P1, an input signal IN is Vss1 (low level), the control signal CLR is Vdd (high level), and the output signal OUT is set to a power supply potential Vss1 (low level) via a transistor T2. The gate potential of a transistor T1 becomes a power supply potential Vss2 via a transistor T4. The operation in the period P1 is referred to as clear (FIG. 7A).

In a period P2, the control signal CLR is at the low level, and the input signal IN and the control signal WR change from the low level to the high level. At this time, the gate potential of a transistor T3 becomes the power supply potential Vdd-Vth5 (Vth5 is the threshold voltage of a transistor T5), and the transistor T3 is placed in the ON state. Since the input signal IN is also supplied to the gate of a transistor T7, the transistor T7 is placed in the ON state as well, and the gate potential of the transistor T1 rises from the power supply potential Vss2. The output signal OUT is maintained at the power supply potential Vss1 via a transistor T6.

Figure 7B:
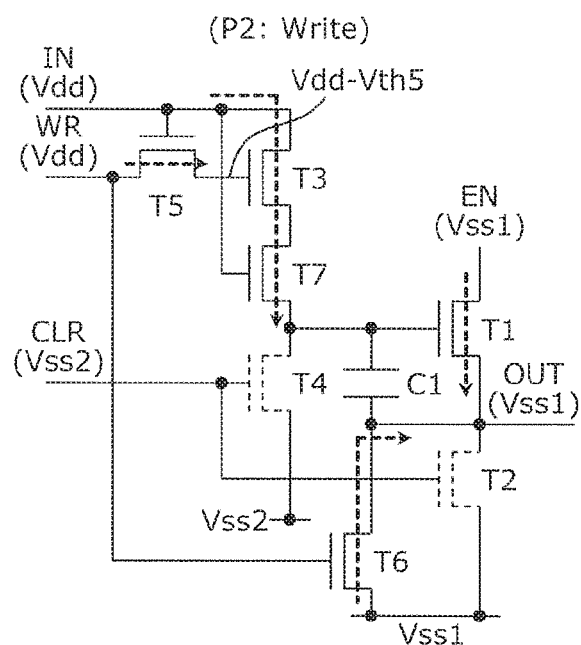
FIG. 7B is a circuit diagram illustrating an example of an operating state of the transfer circuit according to the comparative example.

When the gate potential of the transistor T1 rises and the gate-source voltage Vgs of the transistor T1 becomes greater than the threshold value of the transistor T1, the output signal OUT is set to the power supply potential Vss1 by the transistor T1 in addition to the transistor T2. The potential of the input signal IN is held by a capacitor C1. The operation in the period P2 is referred to as write (FIG. 7B).

Figure 7C:
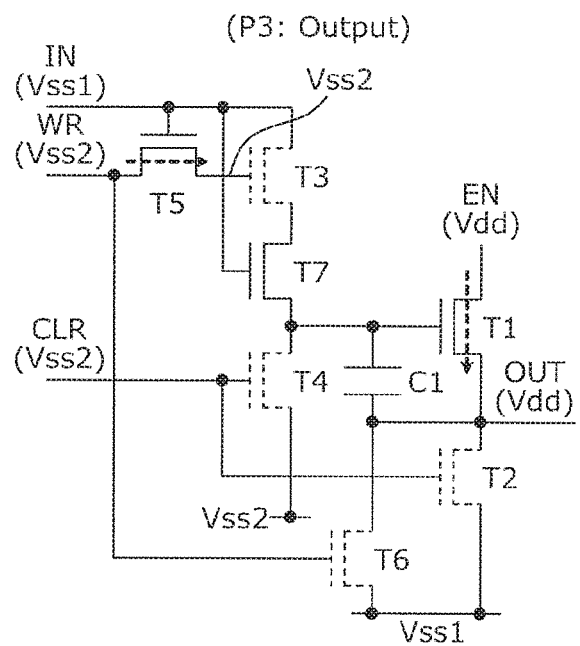
FIG. 7C is a circuit diagram illustrating an example of an operating state of the transfer circuit according to the comparative example.
Figure 7D:
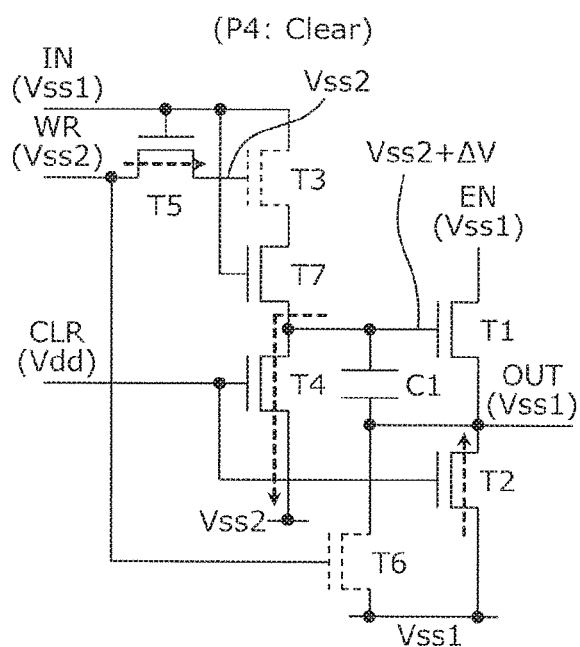
FIG. 7D is a circuit diagram illustrating an example of an operating state of the transfer circuit according to the comparative example.

In a period P3, the input signal IN and the control signal WR are at the low level, and the control signal EN changes from the power supply potential Vss1 to the power supply potential Vdd. At this time, the gate-source voltage Vgs of the transistor T1 is maintained substantially constant by the capacitor C1, and thus a current flows through the transistor T1. The output signal OUT gradually rises from the power supply potential Vss1 (low level) and changes to the power supply potential Vdd (high level) after a lapse of a certain period of time, and the power supply potential Vdd (high level) is transferred to the transfer circuit of the next stage. The operation in the period P3 is referred to as output (FIG. 7C).

The control signal EN again becomes the power supply potential Vss1, and the potential of the gate of the transistor T1 and the potential of the output terminal OUT decrease. The operations of clear, write, and output in the periods P1 to P3 constitute the first transfer operation.

In the periods P4 and P5, the control signal CLR changes from the low level to the high level, and after the control signal CLR is turned off, the control signal WR changes from the low level to the high level. As a result, the output signal OUT is set to the power supply potential Vss1 via the transistor T6.

Figure 7E:
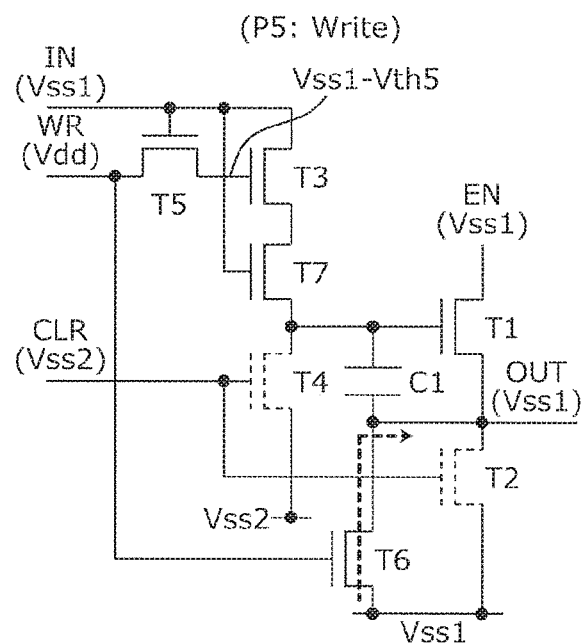
FIG. 7E is a circuit diagram illustrating an example of an operating state of the transfer circuit according to the comparative example.

At this time, the gate potential of the transistor T3 becomes Vss1-Vth5. Here, when the threshold voltages of the transistors included in the transfer circuit are negative, a shoot-through current flows and the gate potential of the transistor T1 becomes the power supply potential Vss2+ΔV (FIG. 7E).

The transistor T1 is placed in the OFF state when the gate-source voltage Vgs of the transistor T1 is smaller than the threshold voltage of the transistor T1.

Figure 7F:
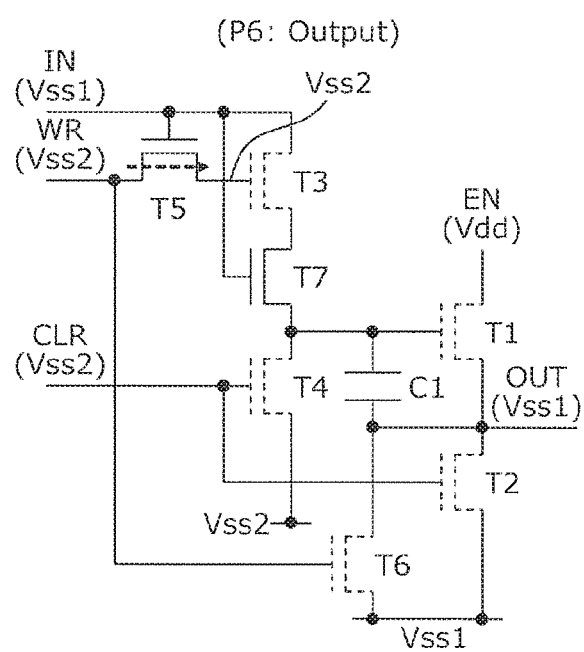
FIG. 7F is a circuit diagram illustrating an example of an operating state of the transfer circuit according to the comparative example.

After the control signal WR changes from the high level to the low level, the control signal EN is changed from the low level to the high level (FIG. 7F). At this time, the transistor T1 is in the OFF state when the gate-source voltage Vgs of the transistor T1 is smaller than the threshold voltage of T1 as described above, and thus, the output signal OUT is maintained at the power supply potential Vss1 even when the potential of the control signal EN changes from the low level to the high level, and the potential of the control signal EN is not transferred to the transfer circuit of the next stage.

Figure 8A:
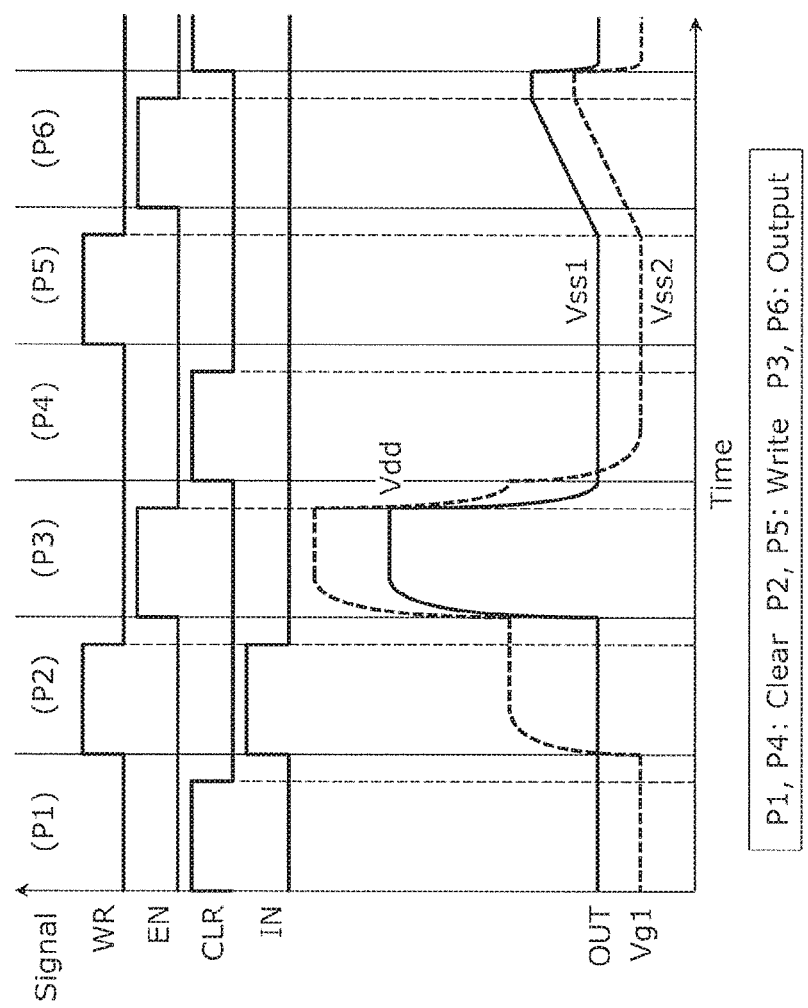
FIG. 8A is a timing chart for describing a problem with the transfer circuit according to the comparative example.

Here, the potential of the output signal OUT is considered. The output signal OUT is set to the power supply potential Vss1 at certain intervals by the transistors T2 and T6, but floats from the power supply potential Vss1 when the control signal EN is at the high level. At this time, the potential of the output signal OUT which is supposed to be at the low level rises in some cases due to leakage current of the transistor T1 and leakage from the buffer circuit 800 and the transfer circuit of the next stage (a period P6 in FIG. 8A). As a result, the output signal OUT whose potential has risen is applied to the transfer circuit of the next stage, bringing about apprehension that an erroneous pulse may be generated due to accumulation of rise in the potential.

Figure 8B:
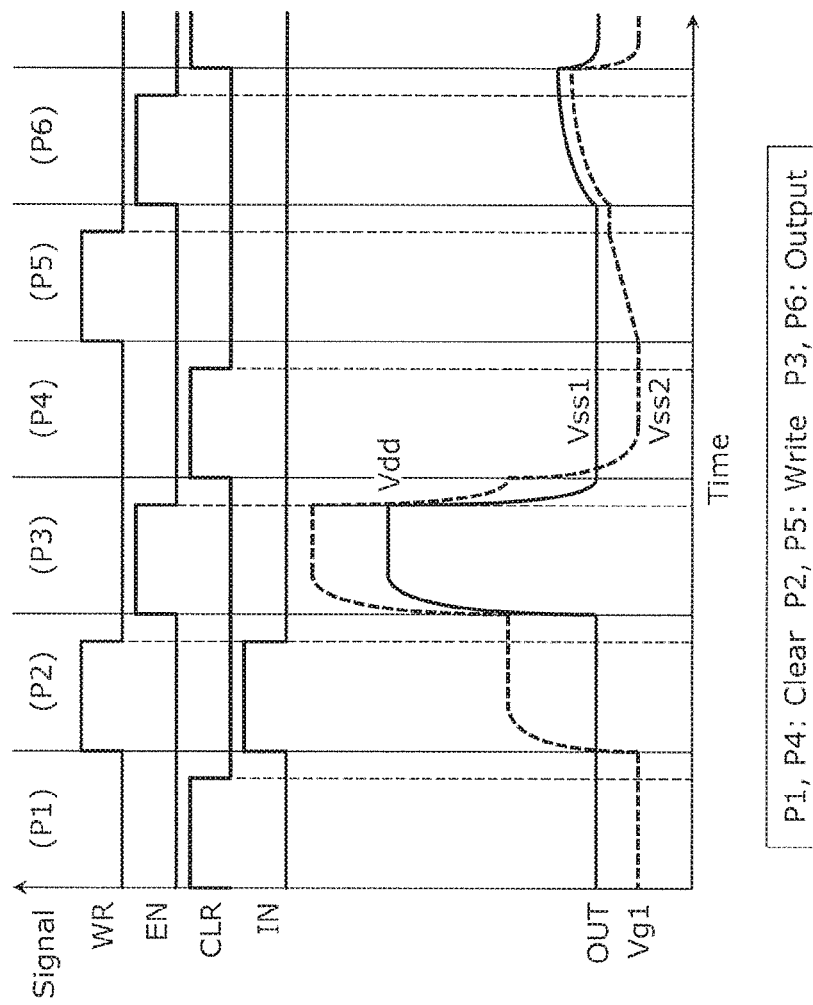
FIG. 8B is a timing chart for describing a problem with the transfer circuit according to the comparative example.

As described above, the gate potential of the transistor T1 becomes Vss2+ΔV when the threshold voltages of the transistors included in the transfer circuit 100 are negative, the control signal EN is at the low level, and the control signal WR is at the high level. Here, an increase in ΔV makes the gate-source voltage Vgs of the transistor T1 greater than the threshold voltage of the transistor T1, and the potential of the output signal OUT which is supposed to be at the low level rises from the power supply potential Vss1 when the control signal EN changes to the high level as illustrated in FIG. 8B (the period P6 in FIG. 8B). As a result, the output signal OUT whose potential has risen is applied to the transfer circuit of the next stage, bringing about apprehension that an erroneous pulse may be generated due to accumulation of rise in the potential.

In view of this, the inventor proposes, as a result of diligent studies, a transfer circuit that does not easily cause an undesired rise in the potential of the output signal OUT, in order to reduce occurrence of such malfunction as described above.

Embodiment 1

The following describes Embodiment 1 of the present disclosure with reference to the drawings.

Figure 9:
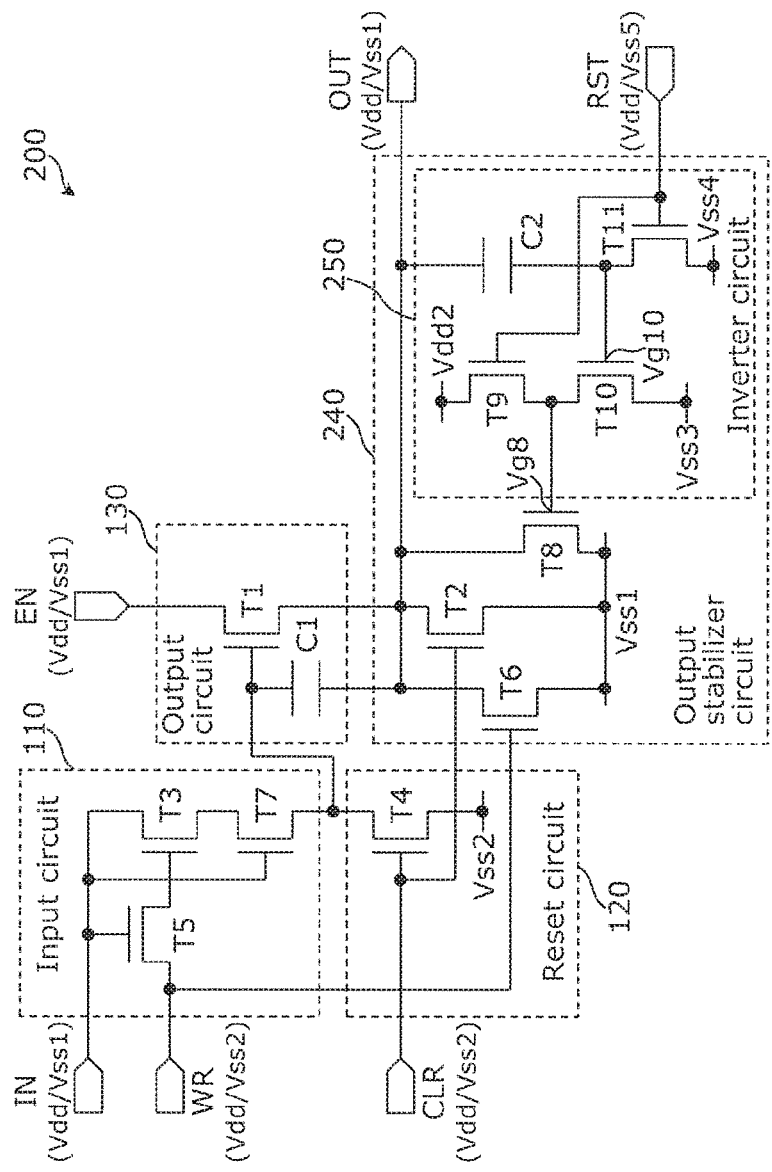
FIG. 9 is a circuit diagram illustrating an example of a configuration of a transfer circuit according to Embodiment 1.

FIG. 9 is a circuit diagram illustrating an example of a configuration of a transfer circuit according to Embodiment 1. In FIG. 9, the parenthesized reference signs added to the signal names are power supply potentials representing the typical potentials of the signals at the high level and the low level.

As illustrated in FIG. 9, a transfer circuit 200 includes an output stabilizer circuit 240 instead of the output stabilizer circuit 140 of the transfer circuit 100 illustrated in FIG. 5. The output stabilizer circuit 240 includes an inverter circuit 250 that outputs an inverted signal of the output signal OUT and a transistor T8, in addition to the elements of the output stabilizer circuit 140.

The inverter circuit 250 includes transistors T9, T10, and T11 and a capacitor C2, and the gates of the transistors T9 and T11 are connected to a control line RST. The capacitor C2 has one end connected to the output terminal OUT of the transfer circuit 200, and the other end connected to the gate of the transistor T10 and one of the source and the drain of the transistor T11.

The gate of the transistor T8 is connected to the output terminal of the inverter circuit 250, and one of the source and the drain of the transistor T8 is connected to a power supply line Vss1 of the output stabilizer circuit 240 and the other is connected to the output terminal OUT.

The transistors T9 and T10 are connected in series between power supply lines Vdd2 and Vss3, and the connection point of the transistors T9 and T10 is connected to the gate of the transistor T8 as the output terminal of the inverter circuit 250. One of the source and the drain of the transistor T11 is connected to a power supply Vss4, and the other is connected to the connection point of the transistor T10 and the capacitor C2.

Here, the transistor T8 is an example of the first transistor, the transistor T9 is an example of the second transistor, the transistor T10 is an example of the third transistor, and the transistor T11 is an example of the fourth transistor. The gate of each transistor is an example of the control signal end, and one and the other of the source and the drain are examples of the first main signal end and the second main signal end. The capacitor C2 is an example of the first capacitor.

Figure 10:
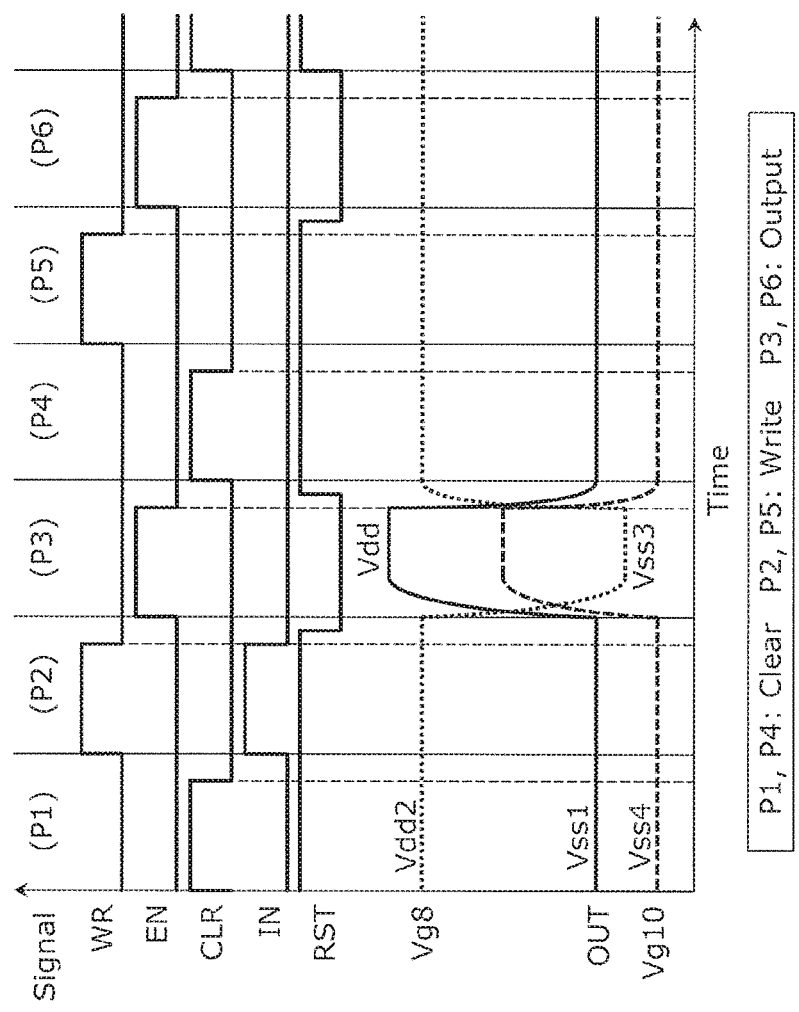
FIG. 10 is a timing chart illustrating an example of operations of the transfer circuit according to Embodiment 1.

FIG. 10 illustrates an example of operation timing of the transfer circuit 200 illustrated in FIG. 9. The control signal RST supplied to the gates of the transistors T9 and T11 is characterized by being at the low level (Vss5 in FIG. 9) when the output signal OUT of the transfer circuit 200 is at the high level.

Note that the voltage setting and the timing setting described above are a mere example. For example, there is no problem with the operation even when the transistor T9 is driven at the power supply potential Vdd instead of the power supply potential Vdd2.

The transfer circuit according to the present embodiment is not limited to the example of the transfer circuit 200. The following describes variations of the transfer circuit.

FIG. 11A to FIG. 11D are circuit diagrams each illustrating an example of a configuration of a transfer circuit according to a variation. In FIG. 11A to FIG. 11D, the parenthesized reference signs added to the signal names are power supply potentials representing the typical potentials of the signals at the high level and the low level.

Figure 11A:
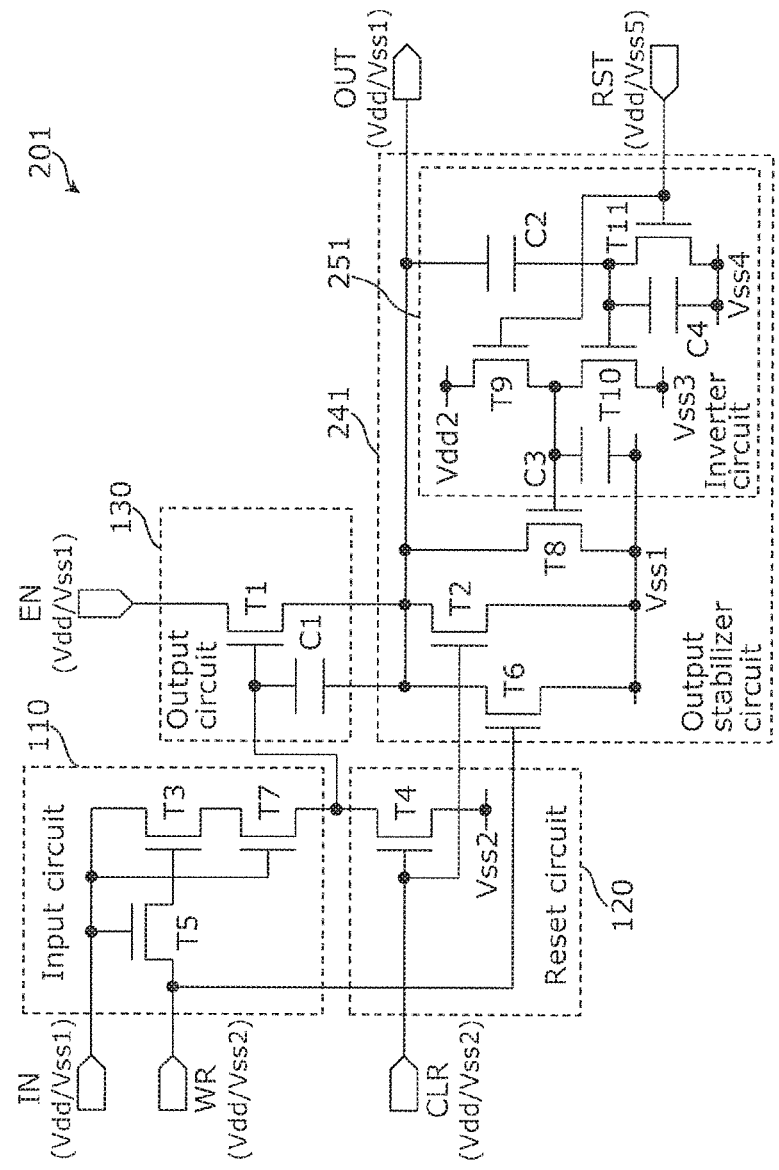
FIG. 11A is a circuit diagram illustrating an example of a configuration of a transfer circuit according to Variation 1 of Embodiment 1.

A transfer circuit 201 illustrated in FIG. 11A includes an output stabilizer circuit 241 instead of the output stabilizer circuit 240 of the transfer circuit 200 in FIG. 9. An inverter circuit 251 of the output stabilizer circuit 241 includes capacitors C3 and C4 in addition to the elements of the Inverter circuit 250. Here, the capacitor C3 is an example of the second capacitor, and the capacitor C4 is an example of the third capacitor. In the output stabilizer circuit 241, the potential at the connection point of the added capacitors C3 and C4 is stabilized, and the adverse effect of noise and the like is therefore reduced.

Figure 11B:
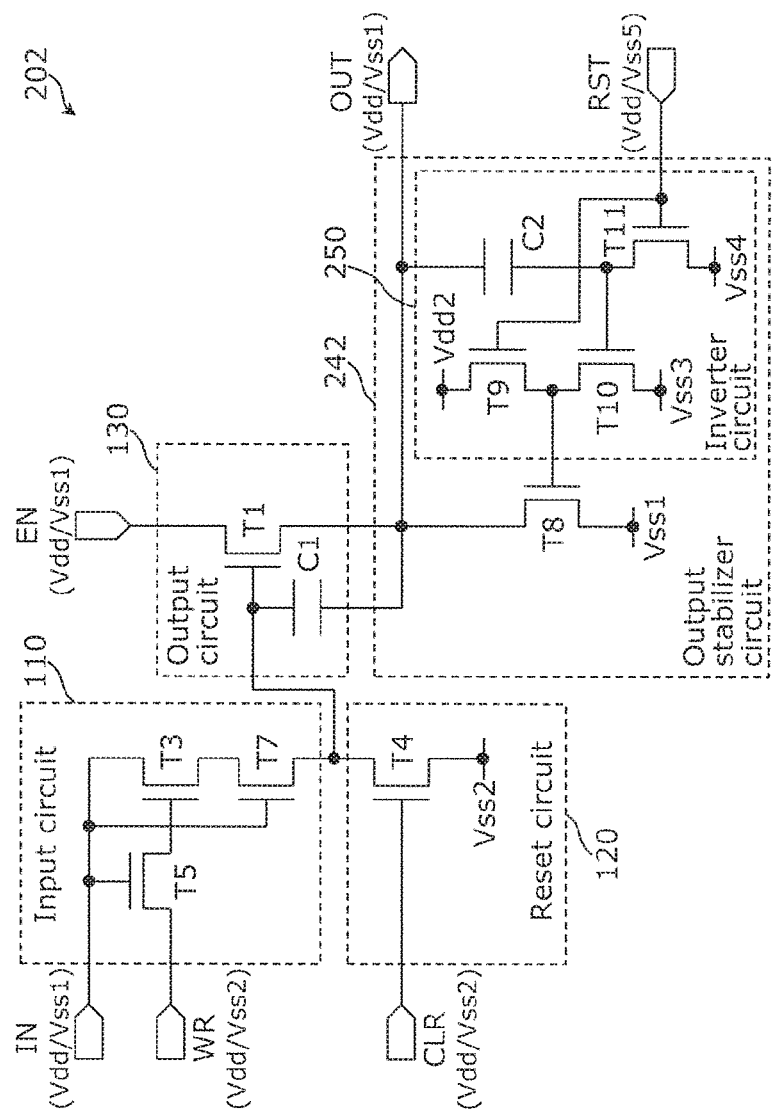
FIG. 11B is a circuit diagram illustrating an example of a configuration of a transfer circuit according to Variation 2 of Embodiment 1.

A transfer circuit 202 illustrated in FIG. 11B includes an output stabilizer circuit 242 instead of the output stabilizer circuit 240 of the transfer circuit 200 in FIG. 9. The output stabilizer circuit 242 is formed by removing the transistors T2 and T6 from the output stabilizer circuit 240. The inverter circuit 250 has such a configuration that the output signal OUT is set to the power supply potential Vss1 by the transistor T8 when the output signal OUT is at the low level, and the transistors T2 and T6 have such a configuration that the output signal OUT is set to the power supply potential Vss1 by the control signal CLR and the control signal WR, respectively. As such, there is no problem with the operation even when the transistors T2 and T6 are removed.

Figure 11C:
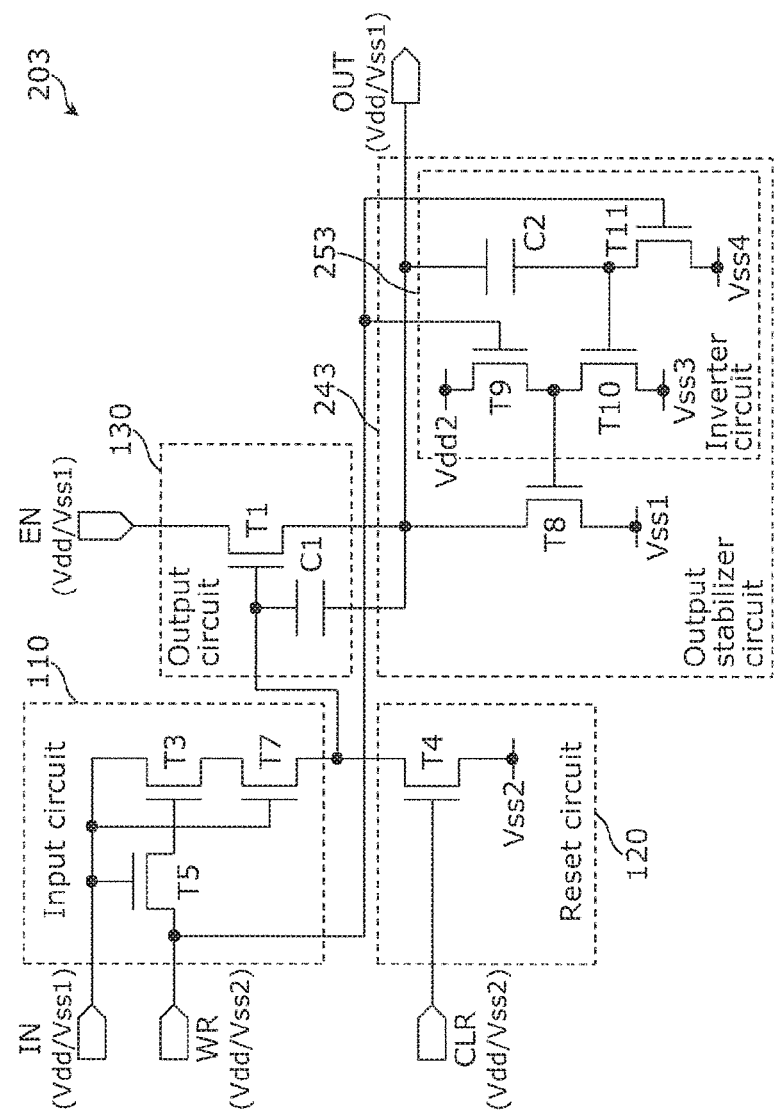
FIG. 11C is a circuit diagram illustrating an example of a configuration of a transfer circuit according to Variation 3 of Embodiment 1.

A transfer circuit 203 illustrated in FIG. 11C includes an output stabilizer circuit 243 instead of the output stabilizer circuit 240 of the transfer circuit 200 in FIG. 9. An inverter circuit 253 of the output stabilizer circuit 243 controls the transistors T9 and T11 using, instead of the control signal RST, the control signal WR applied to the transfer circuit 203. As described above, since the control signal RST is characterized by being at the low level when the output signal OUT of the transfer circuit is at the high level, the transfer circuit 203 can operate without any problem even when the control signal WR is used instead of the control signal RST.

In FIG. 11C, the control signal WR is used instead of the control signal RST, but the control signal CLR may be used, or both the control signal WR and the control signal CLR may be used.

Figure 11D:
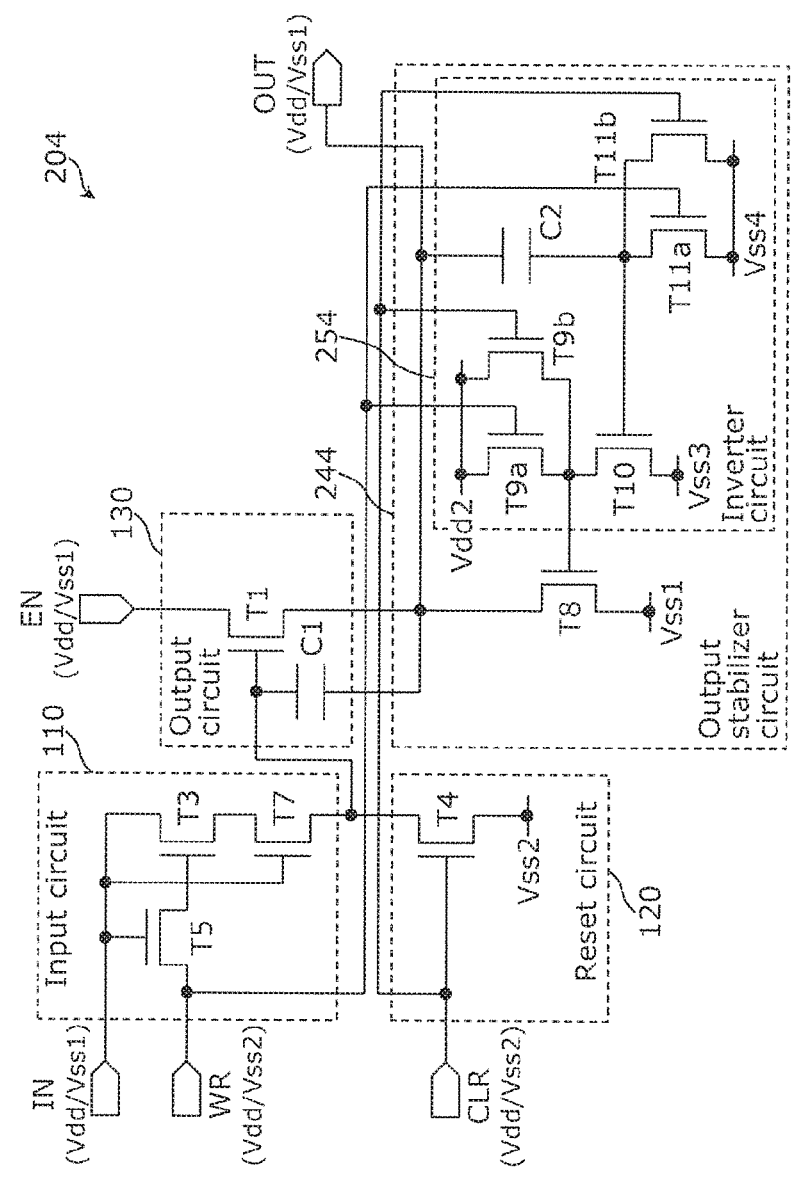
FIG. 11D is a circuit diagram illustrating an example of a configuration of a transfer circuit according to Variation 4 of Embodiment 1.

A transfer circuit 204 illustrated in FIG. 11D includes an output stabilizer circuit 244 instead of the output stabilizer circuit 243 of the transfer circuit 203 in FIG. 11C. In an inverter circuit 254 of the output stabilizer circuit 244, transistors T9a and T9b connected in parallel constitute the transistor T9, and transistors T11a and T11b connected in parallel constitute the transistor T11. The transistors T9a and T11a are controlled by the control signal WR, and the transistors T9b and T11b are controlled by the control signal CLR. The inverter circuit 254 can obtain an inverted signal of the output signal OUT by using both the control signal WR and the control signal CLR instead of the control signal RST.

Next, an example of detailed operations common to the transfer circuits 200 to 204 will be described with reference to the timing chart in FIG. 10 and an output stabilizer circuit in FIG. 12A to FIG. 12D. The output stabilizer circuit illustrated in FIG. 12A to FIG. 12D is based on the output stabilizer circuit 242 illustrated in FIG. 11B, and further includes the capacitor C3 connected between the gate of the transistor T8 and the power supply line Vss1 which is a fixed power supply. The description of the basic operations of the transfer circuit will be omitted as it has been presented above, and the following describes the detailed operations of the inverter circuit and the transistor T8.

Figure 12A:
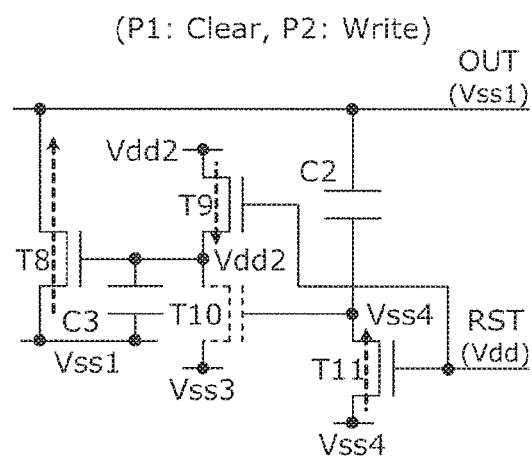
FIG. 12A is a circuit diagram illustrating an example of an operating state of the transfer circuit according to Embodiment 1.

First, in the period P2 in FIG. 10, the input signal IN changes from the low level to the high level, and the gate potential of the transistor T1 rises. At this time, the control signal RST is at the high level, and thus the transistors T9 and T11 are placed in the ON state as illustrated in FIG. 12A. Since the transistor T11 is placed in the ON state, the gate potential of the transistor T10 is set to the power supply potential Vss4. Here, by setting the power supply potentials Vss3 and Vss4 in such a manner that the gate-source voltage of the transistor T10 becomes smaller than the threshold voltage of the transistor T10, the transistor T10 is placed in the OFF state. Further, since the transistor T9 is placed in the ON state, the gate potential of the transistor T8 is set to the power supply potential Vdd2.

The gate potential of the transistor T8 is set to the power supply potential Vdd2 when the power supply potential Vdd2 is lower than or equal to the sum of the high-level potential of the control signal RST and the threshold voltage of the transistor T9. When the power supply potential Vdd2 is higher than or equal to the sum, the gate potential of the transistor T8 is set to the potential of the power supply potential Vdd2-Vth9 (Vth9 is the threshold voltage of the transistor T9). In either case, the transistor T8 is placed in the ON state, and thus the output signal OUT is set to the power supply potential Vss1 via the transistor T8.

Figure 12B:
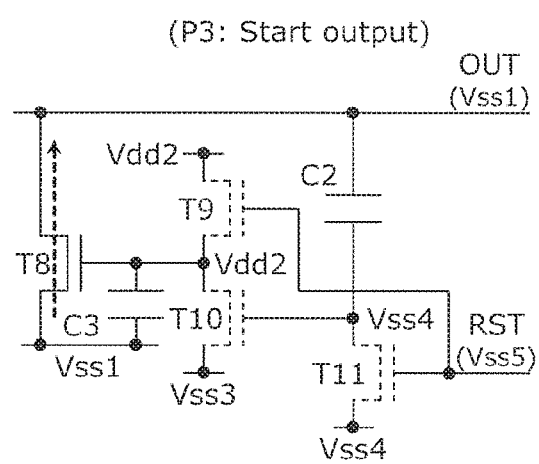
FIG. 12B is a circuit diagram illustrating an example of an operating state of the transfer circuit according to Embodiment 1.

In the period P3 in FIG. 10, the control signal RST is at the low level. At this time, although the transistors T9 and T11 are placed in the OFF state, the potential at each node of the output stabilizer circuit is held and the output signal OUT is set to the power supply potential Vss1 as illustrated in FIG. 12B.

Figure 12C:
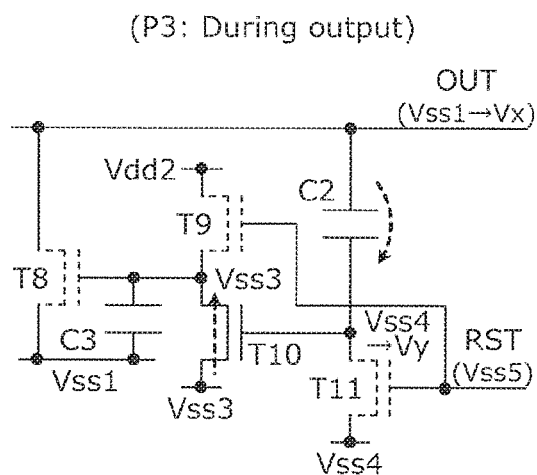
FIG. 12C is a circuit diagram illustrating an example of an operating state of the transfer circuit according to Embodiment 1.

Thereafter, as illustrated in FIG. 12C, the output signal OUT becomes high level (the period P3 in FIG. 10). At this time, the potential of the output signal OUT gradually rises from the power supply potential Vss1. This change in potential raises the gate potential of the transistor T10 via the capacitor C2. When the gate-source voltage Vgs of the transistor T10 becomes greater than the threshold voltage of the transistor T10, the transistor T10 is placed in the ON state as illustrated in FIG. 12C. At this time, the gate potential of the transistor T8 is set to the power supply potential Vss3, the transistor T8 is placed in the OFF state, and the potential of the output signal OUT rises to the power supply potential Vdd.

Figure 12D:
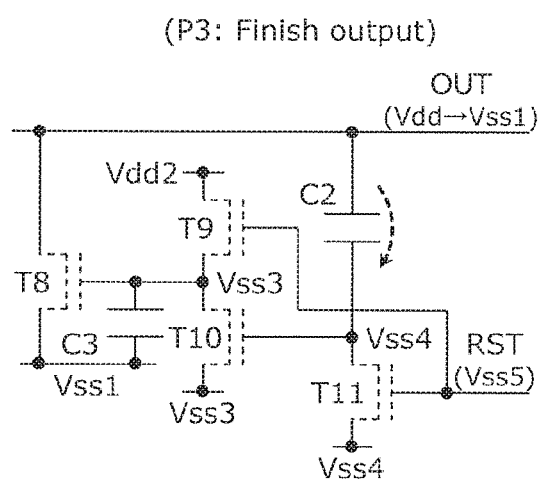
FIG. 12D is a circuit diagram illustrating an example of an operating state of the transfer circuit according to Embodiment 1.

After a lapse of a certain period of time, the control signal EN changes to the low level, and the output signal OUT also changes to the low level (Vss1). This change in potential decreases the gate potential of the transistor T10 via the capacitor C2 as in FIG. 12C, and the transistor T10 is placed in the OFF state again as illustrated in FIG. 12D.

Then, the control signal RST again changes to the high level (the period P4 in FIG. 10), and the output signal OUT is set to the power supply potential Vss1 via the transistor T8 as illustrated in FIG. 12A.

In the circuit of the present disclosure, too, there is a risk that the potential of the output signal OUT rises due to leakage or the like of the transistor T1 when the control signal EN is at the high level. However, the output signal OUT is set to the power supply potential Vss1 via the transistor T8 as long as the transistor T10 is not placed in the ON state. As such, even when the potential of the output signal OUT rises, such a rise in potential can be kept small.

Similarly, even if the threshold voltages of the transistors included in the transfer circuit are negative and the potential of the output signal OUT rises from the power supply potential Vss1 when the control signal EN changes to the high level as illustrated in FIG. 8B, the output signal OUT is set to the power supply potential Vss1 via the transistor T8 as long as the transistor T10 is not placed in the ON state. As such, even when the potential of the output signal OUT rises, such a rise in potential can be kept small.

As a result, for example, in a shift register including a plurality of transfer circuits connected in series, it is possible to reduce unnecessary pulse transfer between transfer circuits.

Embodiment 2

The following describes Embodiment 2 of the present disclosure with reference to the drawings.

Figure 13A:
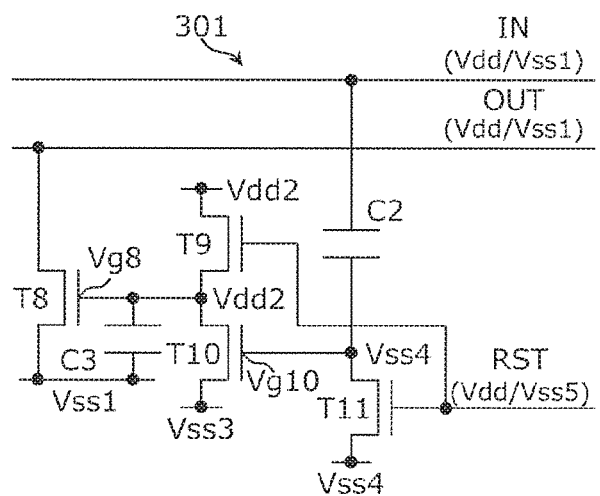
FIG. 13A is a circuit diagram illustrating an example of a configuration of a transfer circuit according to Embodiment 2.
Figure 14A:
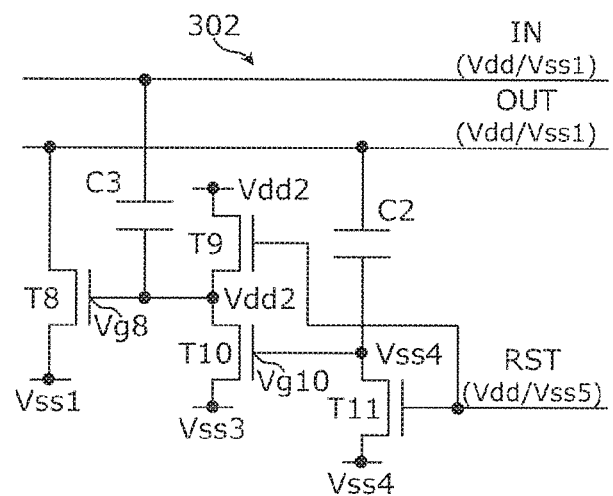
FIG. 14A is a circuit diagram illustrating another example of a configuration of the transfer circuit according to Embodiment 2.

FIG. 13A and FIG. 14A are circuit diagrams each illustrating an example of a configuration of an output stabilizer circuit that is the main part of the transfer circuit according to Embodiment 2.

An output stabilizer circuit 301 in FIG. 13A is based on the output stabilizer circuit illustrated in FIG. 12A to FIG. 12D, and the capacitor C2 is connected to the input terminal IN of the transfer circuit rather than the output terminal OUT. The output stabilizer circuit 301 is driven according to the control signals and the input signal illustrated in FIG. 13B, for example. FIG. 13C illustrates an example of operation waveforms of the output stabilizer circuit 301. The control signal RST is characterized by being at the low level when the potential of the input signal IN and the potential of the output signal OUT are at the high level.

This configuration is an example of the configuration in which a control signal (control signal RST) applied to a control signal end (gate) of the second transistor (transistor T9) and a control signal (control signal RST) applied to a control signal end (gate) of the fourth transistor (transistor T11) are at a low level when the output signal OUT and the input signal IN of the transfer circuit are at a high level (the write period and the output period), and change to a high level at least once when the output signal OUT and the input signal IN of the transfer circuit are at a low level (the clear period).

Figure 14B:
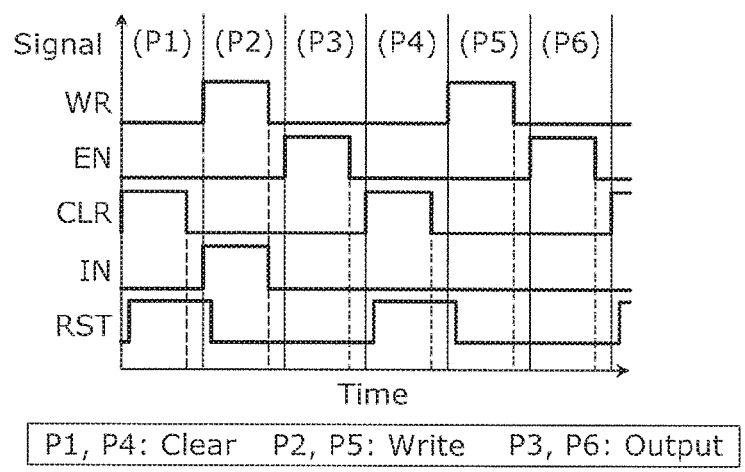
FIG. 14B is a timing chart illustrating another example of the clear signal according to Embodiment 2.
Figure 14C:
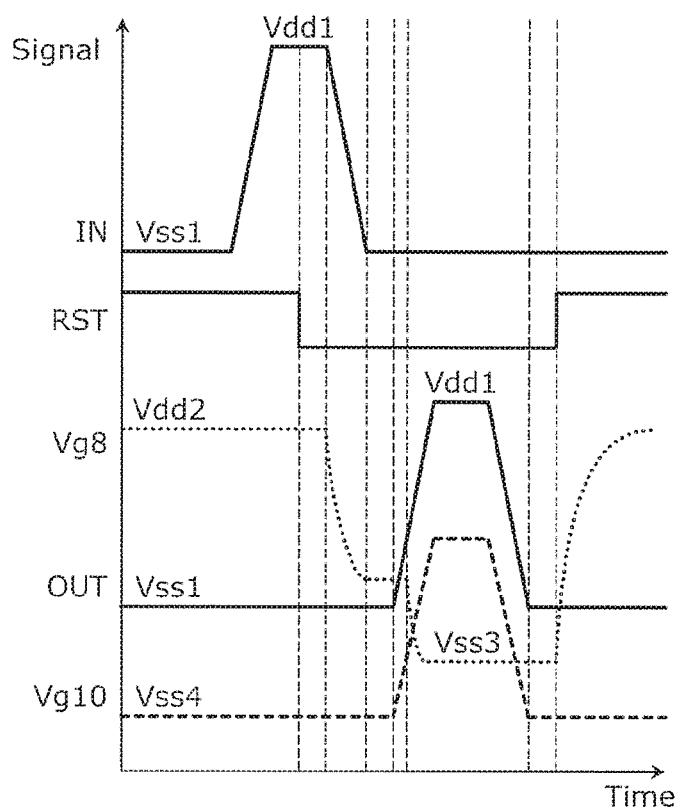
FIG. 14C is a timing chart illustrating another example of operations of the transfer circuit according to Embodiment 2.

An output stabilizer circuit 302 in FIG. 14A is based on the output stabilizer circuit illustrated in FIG. 12A to FIG. 12D, and one end of the capacitor C3 is connected to the input terminal IN rather than the power supply line Vss1 which is a fixed power supply. The output stabilizer circuit 302 is driven according to the control signals and the input signal illustrated in FIG. 14B, for example. FIG. 14C Illustrates an example of operation waveforms of the output stabilizer circuit 302. The control signal RST is characterized by being at the low level when the potential of the output signal OUT is at the high level and changing from the high level to the low level when the potential of the input signal IN is at the high level.

This configuration is an example of the configuration in which a control signal (control signal RST) applied to a control signal end (gate) of the second transistor (transistor T9) and a control signal (control signal RST) applied to a control signal end (gate) of the fourth transistor (transistor T11) are at a low level when the output signal of the transfer circuit is at a high level (the output period), change from a high level to the low level when the input signal IN of the transfer circuit is at a high level (partway in the write period), and change to the high level at least once when the output signal OUT of the transfer circuit is at a low level (the clear period).

Next, an advantageous effect of the output stabilizer circuits 301 and 302 will be described based on comparison with the output stabilizer circuit according to Embodiment 1 (for example, the output stabilizer circuit 242).

Figure 15:
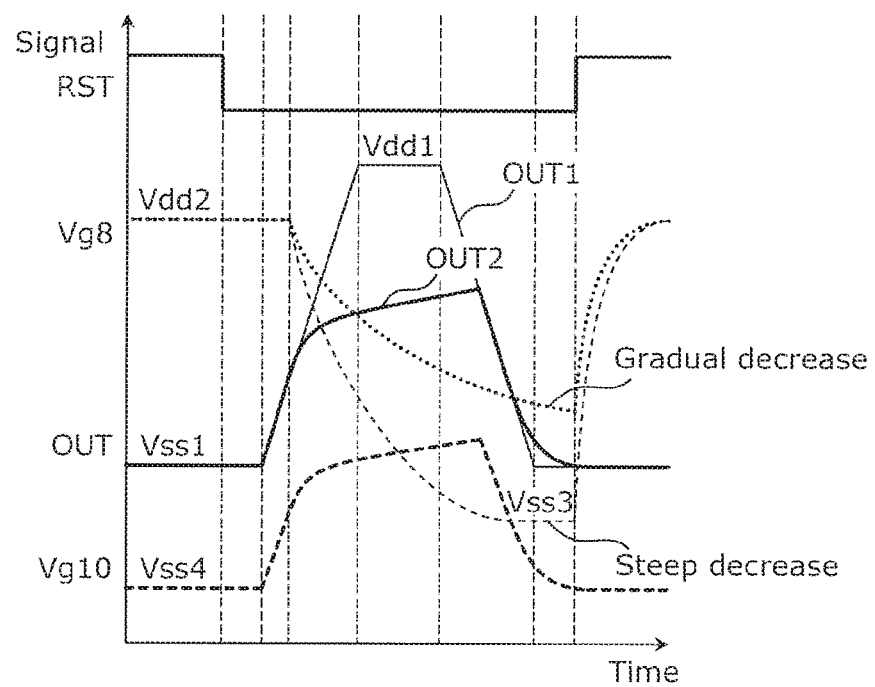
FIG. 15 is a timing chart illustrating an example of operation of the transfer circuit according to Embodiment 1.

FIG. 15 is an enlarged view of signal waveforms when the output signal OUT changes to the high level in the output stabilizer circuit 242 illustrated in FIG. 11B.

In FIG. 15, a waveform OUT1 indicates the potential of the output signal OUT when a gate potential Vg8 of the transistor T8 steeply decreases to the power supply potential Vss3 after the transistor T10 is placed in the ON state. The potential of the output signal OUT immediately reaches the power supply potential Vdd1 which is a high-level potential. In this case, the output signal OUT is correctly transferred to the transfer circuit of the next stage.

In comparison to this, consider a case where the gate potential Vg8 of the transistor T8 gradually decreases after the transistor T10 is placed in the ON state. When the decrease in the gate potential of the transistor T8 is gradual, a period during which both the transistors T1 and T8 are in the ON state occurs, and a shoot-through current flows through the transfer circuit via the transistors T1 and T8. As a result, the potential of the output signal OUT gradually rises as indicated by a waveform OUT2.

When the control signal EN changes from the high level to the low level before the output signal OUT reaches the power supply potential Vdd1 which is a high-level potential, the potential of the output signal OUT decreases to the power supply potential Vss1 and the output signal OUT is applied to the next stage without sufficient amplitude, thus inhibiting normal transfer.

As a countermeasure against this, in the output stabilizer circuit 301 in FIG. 13A, the capacitor C2 is connected to the input terminal IN rather than the output terminal OUT.

Figure 13B:
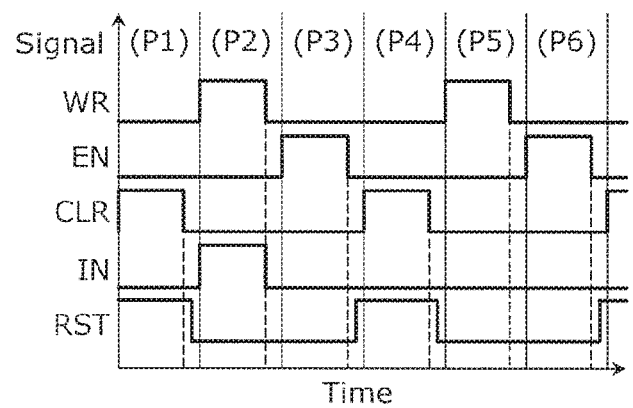
FIG. 13B is a timing chart illustrating an example of a clear signal according to Embodiment 2.
Figure 13C:
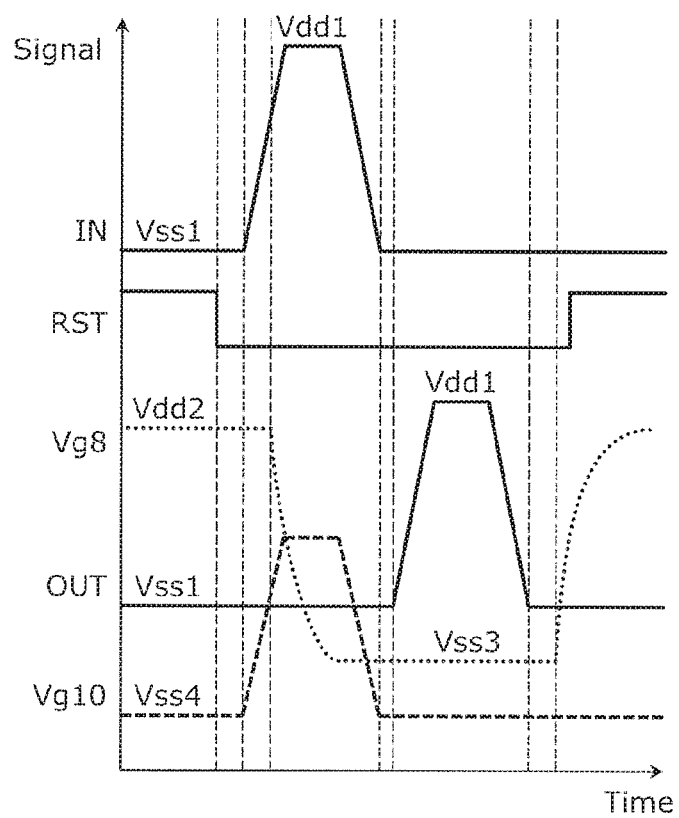
FIG. 13C is a timing chart illustrating an example of operations of the transfer circuit according to Embodiment 2.

Further, as illustrated in FIG. 13B, the control signal RST is set to be at the low level when the potentials of the input signal IN and the output signal OUT of the transfer circuit are at the high level (for example, during the write period and the output period).

With such a configuration, a shoot-through current does not flow through the transfer circuit even when the gate potential Vg8 of the transistor T8 gradually decreases after the transistor T10 is placed in the ON state as a result of the change in potential of the input signal IN from the low level to the high level.

There is a certain period of time from when the gate potential Vg8 of the transistor T8 decreases to when the potential of the output signal OUT of the transfer circuit changes from the low level to the high level. Thus, when the potential of the output signal OUT changes from the low level to the high level, the gate potential of the transistor T8 can be reduced, and the potential of the output signal OUT is not significantly decreased by a shoot-through current.

In the output stabilizer circuit 302 in FIG. 14A, the capacitor C2 is connected to the output terminal OUT of the transfer circuit, but one end of the capacitor C3 is connected to the input terminal IN rather than the fixed power supply. Further, as illustrated in FIG. 14B, the control signal RST is set to be at the low level when the potential of the output signal OUT of the transfer circuit is at the high level (for example, during the output period) and is also set to change from the high level to the low level when the potential of the input signal IN is at the high level (for example, partway in the write period).

With such a configuration, the potential of the input signal IN changes from the low level to the high level in a state where the control signal RST is at the high level, and thus, the gate potential of the transistor T8 is set to the power supply potential Vdd2 when the transistor T9 is in the ON state, that is, when a voltage value obtained by subtracting the power supply potential Vdd2 from the power supply potential Vdd is set to be greater than the threshold voltage of the transistor T9.

Thereafter, the transistor T9 is placed in the OFF state through a change in the control signal RST from the high level to the low level when the input signal IN is at the high level, and then, the input signal IN is changed from the high level to the low level. At this time, since the transistor T9 is in the OFF state, the change in the potential of the input signal IN decreases the gate potential of the transistor T8 via the capacitor C3.

After a lapse of a certain period of time, the output signal OUT changes from the low level to the high level. With this change in potential, the transistor T10 is placed in the ON state and the gate potential of the transistor T8 decreases. At this time, it is possible to make the gate potential of the transistor T8 lower than that in FIG. 15, thereby inhibiting a significant decrease in the potential of the output terminal OUT caused by a shoot-through current.

As described above, with the output stabilizer circuits 301 and 302, the output terminal OUT of the transfer circuit can be grounded and it is possible to inhibit a significant change in potential of the output signal OUT caused by leakage current of the transistor and leakage from the buffer circuit and the transfer circuit of the next stage. As a result, occurrence of erroneous transfer, that is, a transfer of unnecessary pulses, can be reduced.

It is also possible to reduce occurrence of transfer failure caused by a decrease in potential of the output signal OUT due to a shoot-through current that flows when the potential of the output signal OUT of the transfer circuit changes from the low level to the high level.

Although a transfer circuit and a shift register including a plurality of transfer circuits connected in series according to exemplary embodiments have been described above, the present disclosure is not limited to the embodiments described above. The present disclosure also encompasses a display device and a driving method thereof obtained by making various modifications conceivable to a person skilled in the art and freely combining the structural elements and operations in the embodiments within the scope of the essence of the present disclosure.

For example, the present disclosure may encompass a gate driver including: a shift register according to the present disclosure; and a buffer circuit that processes an output signal from each stage of the shift register.

Furthermore, for example, the present disclosure may encompass a display panel including a gate driver according to the present disclosure and a flexible substrate including a gate driver according to the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are Intended to be included within the scope of the present disclosure.

INDUSTRIAL APPLICABILITY

The present disclosure is, as a transfer circuit and a shift register including a plurality of transfer circuits connected in series, applicable to a scanning circuit in a display device, for example.

The invention claimed is:

1. A transfer circuit that includes an input circuit, a reset circuit, an output circuit, and an output stabilizer circuit, and obtains an input signal at an input terminal, holds the input signal, and outputs the input signal from an output terminal as an output signal in synchronization with a clock signal, the transfer circuit comprising, in the output stabilizer circuit:
    an inverter circuit that is connected to one or both of the input terminal and the output terminal of the transfer circuit, and outputs an inverted signal from an output terminal, the inverted signal having an inverted polarity of at least one of the input signal and the output signal; and
    a first transistor having a control signal end connected to the output terminal of the inverter circuit, a first main signal end connected to a first power supply that is a power supply for the output stabilizer circuit, and a second main signal end connected to the output terminal of the transfer circuit, wherein
    the inverter circuit includes:
        a second transistor having a first main signal end connected to a second power supply and a second main signal end connected to the output terminal of the inverter circuit;
        a third transistor having a first main signal end connected to the output terminal of the inverter circuit and a second main signal end connected to a third power supply;
        a fourth transistor having a first main signal end connected to a control signal end of the third transistor and a second main signal end connected to a fourth power supply; and
        a first capacitor having one end connected to the control signal end of the third transistor and an other end connected to the output terminal of the transfer circuit.

2. The transfer circuit according to claim 1, wherein the second power supply has a potential higher than a low-level potential of the output signal of the transfer circuit, the third power supply has a potential lower than or equal to the low-level potential, and the fourth power supply has a potential lower than or equal to the potential of the third power supply.

3. The transfer circuit according to claim 1, further comprising:
    a second capacitor connected between the output terminal of the inverter circuit and a fixed power supply.

4. The transfer circuit according to claim 1, further comprising:
    a second capacitor connected between the control signal end of the third transistor and a fixed power supply.

5. The transfer circuit according to claim 1, wherein a control signal applied to a control signal end of the second transistor and a control signal applied to a control signal end of the fourth transistor are at a low level when the output signal of the transfer circuit is at a high level, and change to a high level at least once when the output signal of the transfer circuit is at a low level.

6. The transfer circuit according to claim 5, wherein the control signal applied to the control signal end of the second transistor and the control signal applied to the control signal end of the fourth transistor are identical.

7. The transfer circuit according to claim 6, wherein the control signal applied to the control signal end of the second transistor and the control signal applied to the control signal end of the fourth transistor are identical to a control signal applied to at least one of the input circuit and the reset circuit of the transfer circuit.

8. A transfer circuit that includes an input circuit, a reset circuit, an output circuit, and an output stabilizer circuit, and obtains an input signal at an input terminal, holds the input signal, and outputs the input signal from an output terminal as an output signal in synchronization with a clock signal, the transfer circuit comprising, in the output stabilizer circuit:
    an inverter circuit that is connected to one or both of the input terminal and the output terminal of the transfer circuit, and outputs an inverted signal from an output terminal, the inverted signal having an inverted polarity of at least one of the input signal and the output signal; and
    a first transistor having a control signal end connected to the output terminal of the inverter circuit, a first main signal end connected to a first power supply that is a power supply for the output stabilizer circuit, and a second main signal end connected to the output terminal of the transfer circuit, wherein
    the inverter circuit includes:
        a second transistor having a first main signal end connected to a second power supply and a second main signal end connected to the output terminal of the inverter circuit;

a third transistor having a first main signal end connected to the output terminal of the inverter circuit and a second main signal end connected to a third power supply;

a fourth transistor having a first main signal end connected to a control signal end of the third transistor and a second main signal end connected to a fourth power supply; and a first capacitor having one end connected to the control signal end of the third transistor and an other end connected to the input terminal of the transfer circuit.

9. The transfer circuit according to claim 8, wherein the second power supply has a potential higher than a low-level potential of the output signal of the transfer circuit, the third power supply has a potential lower than or equal to the low-level potential, and the fourth power supply has a potential lower than or equal to the potential of the third power supply.

10. The transfer circuit according to claim 8, further comprising:

a second capacitor connected between the output terminal of the inverter circuit and a fixed power supply.

11. The transfer circuit according to claim 8, wherein a control signal applied to a control signal end of the second transistor and a control signal applied to a control signal end of the fourth transistor are at a low level when the output signal and the input signal of the transfer circuit are at a high level, and change to a high level at least once when the output signal and the input signal of the transfer circuit are at a low level.

12. The transfer circuit according to claim 11, wherein the control signal applied to the control signal end of the second transistor and the control signal applied to the control signal end of the fourth transistor are identical.

13. The transfer circuit according to claim 12, wherein the control signal applied to the control signal end of the second transistor and the control signal applied to the control signal end of the fourth transistor are identical to a control signal applied to at least one of the input circuit and the reset circuit of the transfer circuit.

14. A transfer circuit that includes an input circuit, a reset circuit, an output circuit, and an output stabilizer circuit, and obtains an input signal at an input terminal, holds the input signal, and outputs the input signal from an output terminal as an output signal in synchronization with a clock signal, the transfer circuit comprising, in the output stabilizer circuit:

an inverter circuit that is connected to one or both of the input terminal and the output terminal of the transfer circuit, and outputs an inverted signal from an output terminal, the inverted signal having an inverted polarity of at least one of the input signal and the output signal; and a first transistor having a control signal end connected to the output terminal of the inverter circuit, a first main signal end connected to a first power supply that is a power supply for the output stabilizer circuit, and a second main signal end connected to the output terminal of the transfer circuit, wherein the inverter circuit includes:

a second transistor having a first main signal end connected to a second power supply and a second main signal end connected to the output terminal of the inverter circuit;

a third transistor having a first main signal end connected to the output terminal of the inverter circuit and a second main signal end connected to a third power supply;

a fourth transistor having a first main signal end connected to a control signal end of the third transistor and a second main signal end connected to a fourth power supply;

a first capacitor having one end connected to the control signal end of the third transistor and an other end connected to the output terminal of the transfer circuit; and a second capacitor having one end connected to the input terminal of the transfer circuit and an other end connected to the output terminal of the inverter circuit.

15. The transfer circuit according to claim 14, wherein the second power supply has a potential higher than a low-level potential of the output signal of the transfer circuit, the third power supply has a potential lower than or equal to the low-level potential, and the fourth power supply has a potential lower than or equal to the potential of the third power supply.

16. The transfer circuit according to claim 14, wherein a control signal applied to a control signal end of the second transistor and a control signal applied to a control signal end of the fourth transistor are at a low level when the output signal of the transfer circuit is at a high level, change from a high level to the low level when the input signal of the transfer circuit is at a high level, and change to the high level at least once when the output signal of the transfer circuit is at a low level.

17. The transfer circuit according to claim 16, wherein the control signal applied to the control signal end of the second transistor and the control signal applied to the control signal end of the fourth transistor are identical.

18. The transfer circuit according to claim 17, wherein the control signal applied to the control signal end of the second transistor and the control signal applied to the control signal end of the fourth transistor are identical to a control signal applied to at least one of the input circuit and the reset circuit of the transfer circuit.

* * * * *